United States Patent [19]

Morii et al.

[11] Patent Number: 5,453,316
[45] Date of Patent: Sep. 26, 1995

[54] COMPOSITE ELECTRONIC PART

[75] Inventors: Hiroshi Morii; Hiroshi Komatsu; Tomoaki Ushiro; Tomio Yamasaki; Toshio Kawabata, all of Nagaokakyo, Japan

[73] Assignee: Murata Mfg. Co., Ltd., Japan

[21] Appl. No.: 240,327

[22] Filed: May 10, 1994

[30] Foreign Application Priority Data

May 11, 1993 [JP] Japan .................... 5-133888

[51] Int. Cl.⁶ .................... B32B 9/00
[52] U.S. Cl. .................... 428/210; 428/432; 428/457; 428/901
[58] Field of Search .................... 428/210, 432, 428/457, 901

[56] References Cited

U.S. PATENT DOCUMENTS

| | | | |
|---|---|---|---|
| 4,746,557 | 5/1988 | Sakamoto et al. | 428/138 |
| 4,889,760 | 12/1989 | Kippenberg et al. | 428/192 |
| 5,045,380 | 9/1991 | Kobayashi et al. | 428/195 |
| 5,077,270 | 12/1991 | Takeda et al. | 505/1 |
| 5,111,003 | 5/1992 | Kimbara | 174/255 |
| 5,232,765 | 8/1993 | Yano et al. | 428/195 |

Primary Examiner—Patrick J. Ryan
Assistant Examiner—Kam F. Lee
Attorney, Agent, or Firm—Ostrolenk, Faber, Gerb & Soffen

[57] ABSTRACT

A composite electronic part includes a dielectric ceramic portion consisting of a Pb group dielectric material. Inside the dielectric ceramic portion, an internal electrode constituting a portion of a capacitor is formed. The dielectric ceramic portion is bonded to a magnetic ceramic portion consisting of a Ni—Zn group ferrite material by an intermediate layer consisting of a ceramic material containing Pb, Ni, Fe and Nb as main components. Inside the magnetic ceramic portion, an internal electrode constituting a portion of an inductor is formed. Furthermore, at end portions of the dielectric ceramic portion, intermediate layer and magnetic ceramic portion, a plurality of external electrodes consisting of, for example, Ag are formed, and connected to the predetermined internal electrodes.

4 Claims, 1 Drawing Sheet

COMPOSITE ELECTRONIC PART

BACKGROUND OF THE INVENTION

1. Field of the Invention

The present invention relates to a composite electronic part, and particularly to composite electronic part such as a laminated LC filter and the like having a dielectric ceramic portion and a magnetic ceramic portion which are co-sintered.

2. Description of the Prior Art

In a conventional laminated LC filter which is the background of the present invention, a dielectric ceramic portion and a magnetic ceramic portion are bonded together directly by pressing and bonding a dielectric green sheet and a magnetic green sheet before firing.

However, in the conventional laminated LC filter in which the dielectric ceramic portion and the magnetic ceramic portion are bonded together directly, due to a mutual diffusion produced between the dielectric ceramic portion and the magnetic ceramic portion during firing, insulation resistance drops, or due to a concentrated stress occurred between the dielectric ceramic portion and the magnetic ceramic portion during firing, the bonding interface between the dielectric ceramic portion and the magnetic ceramic portion sometimes separates.

Furthermore, in the conventional laminated LC filter, as is disclosed in Japanese Patent Provisional Publication No. 90915/1984, No. 172804/1983 and Japanese Patent Publication No. 33247/1984, a layer consisting of a mixture of dielectric material, magnetic material, glass and metal is formed between the dielectric green sheet and the magnetic green sheet, which are fired to form an intermediate layer between the dielectric ceramic portion and the magnetic ceramic portion.

In the conventional laminated LC filter in which the intermediate layer is formed between the dielectric ceramic portion and the magnetic ceramic portion, the stress between the dielectric ceramic portion and the magnetic ceramic portion produced by firing is relaxed. In such a conventional composite electronic part in which the intermediate layer is formed, since the dielectric ceramic portion and the magnetic ceramic portion are co-sintered at a low temperature of 1000° C. or less, in the case of using a Pb group dielectric material as the material of the dielectric ceramic portion and a Ni—Zn group ferrite material as the material of the magnetic ceramic portion, the mutual diffusion between the dielectric ceramic portion and the magnetic ceramic portion can not be prevented, and thus it is not effective as the intermediate layer. When glass is mixed into the intermediate layer, a glass component is diffused to deteriorate electrical characteristics in some cases.

As such, the property of the intermediate layer between the dielectric ceramic portion and the magnetic ceramic portion depends greatly on material compositions of the dielectric ceramic portion and the magnetic ceramic portion. And hence, as the material of the intermediate layer, the material which is adaptable to that of the dielectric ceramic portion and the magnetic ceramic portion must be selected. When the material which is not adaptable to that of the dielectric ceramic portion and the magnetic ceramic portion is used as the material of the intermediate layer, the function as the intermediate layer can not be exhibited and it can not be used as the complex electronic part.

SUMMARY OF THE INVENTION

It is, therefore, a primary object of the present invention to provide a composite electronic part, wherein the adhesiveness between a dielectric ceramic portion consisting of a Pb group dielectric material and a magnetic ceramic portion consisting of a Ni—Zn group ferrite material which are co-sintered is improved, mutual diffusion therebetween is prevented and deterioration of electrical characteristics is small.

The present invention is directed to a composite electronic part comprising a dielectric ceramic portion and a magnetic ceramic portion which are co-sintered, wherein the dielectric ceramic portion consists of a Pb group dielectric material, the magnetic ceramic portion consists of a Ni—Zn group ferrite material, and an intermediate layer consisting of a ceramic material containing Pb, Ni, Fe and Nb as main components is formed between the dielectric ceramic portion and the magnetic ceramic portion.

As the material of the dielectric ceramic portion, preferably a lead composite perovskite compound which is represented by a formula $PbAO_3$, where A is tetravalent ions containing at least one member selected from the group consisting of Bi, Mg, Fe, Co, Ba, Ca, Sr, Zr, Sn, Sb, Ge, Ni, Zn, W, Cu, Nb, Ti and Mn is used.

By the intermediate layer consisting of a ceramic material containing Pb, Ni, Fe and Nb as main components, the dielectric ceramic portion consisting of the Pb group dielectric material and the magnetic ceramic portion consisting of the Ni—Zn group ferrite material are firmly bonded together.

Furthermore, the mutual diffusion between dielectric ceramic portion consisting of the Pb group dielectric material and the magnetic ceramic portion consisting of the Ni—Zn group ferrite material is prevented, and deterioration of the electrical characteristics is suppressed by the intermediate layer.

According to the present invention, adhesiveness between the dielectric ceramic portion consisting of the Pb group dielectric material and the magnetic ceramic portion consisting of the Ni—Zn group ferrite material is improved, and the relative diffusion therebetween is prevented, thus a composite electronic part with little deterioration of the electrical characteristics is obtained.

The above and other objects, features, aspects and advantages of the present invention will become more apparent from the following detailed description made with reference to the drawings.

DESCRIPTION OF THE PREFERRED EMBODIMENTS

Figure 1:
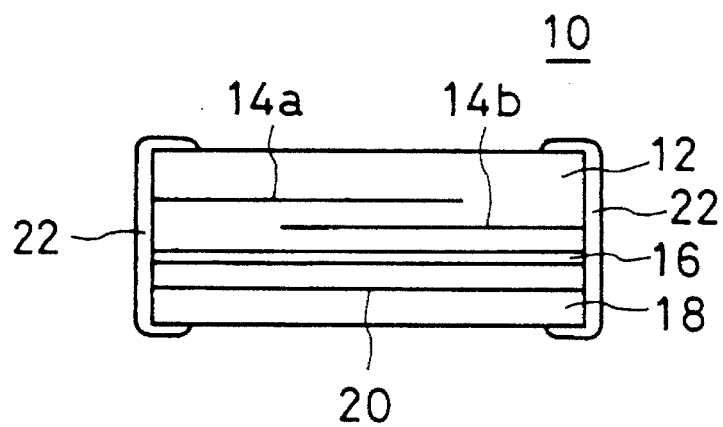
FIG. 1 is a sectional illustrative view showing one embodiment of the present invention.

FIG. 1 is a sectional illustrative view showing one embodiment of the present invention. A composite electronic part 10 includes a dielectric ceramic portion 12 consisting of, for example, a $Pb(Ni_{1/3} Nb_{2/3})O_3$—$Pb(Zn_{1/2} W_{1/2})O_3$—$PbTiO_3$—$Pb(Cu_{1/3} Nb_{2/3})O_3$ series lead composite perovskite compound. Inside the dielectric ceramic portion 12, internal electrodes 14a and 14b constituting a portion of a capacitor are formed. Although Pb group dielectric materials other than the above-mentioned material may be used as the material of the dielectric ceramic portion 12, preferably the lead composite perovskite compound is represented by the formula of $PbAO_3$, where A is tetravalent ions containing at least one member selected from the group consisting of Bi, Mg, Fe, Co, Ba, Ca, Sr, Zr, Sn, Sb, Ge, Ni, Zn, W, Cu, Nb, Ti and Mn is used.

The dielectric ceramic portion 12 is bonded to a magnetic ceramic portion 18 consisting of, for example, a (Ni, Zn, Cu)—$Fe_2O_4$ series ferrite material by an intermediate layer 16 consisting of a ceramic material containing, for example, 0.5 $Pb(Fe_{1/2} Nb_{1/2})O_3$—0.5 $Pb(Ni_{1/2} Nb_{1/2})O_3$ as main components. As the material of the intermediate layer 16, a ceramic material containing Pb, Ni, Fe and Nb as main components may be used besides the above-mentioned material. As the material of the magnetic ceramic portion 18, Ni—Zn group ferrite materials other than the above-mentioned material may be used. Inside the magnetic ceramic portion 18, an internal electrode 20 constituting a portion of an inductor is formed.

At end portions of the dielectric ceramic portion 12, intermediate layer 16 and magnetic ceramic portion 18, a plurality of external electrodes 22 consisting of, for example, Ag are formed and connected respectively to the predetermined internal electrodes.

Next, an example of method of manufacturing the composite electronic part 10 is described.

As the material of the dielectric ceramic portion 12, for example, the $Pb(Ni_{1/3} Nb_{2/3})O_3$— $Pb(Zn_{1/2} W_{1/2})O_3$—$PbTiO_3$—$Pb(Cu_{1/3} Nb_{2/3})O_3$ series lead composite perovskite compound is prepared.

Meanwhile, as the material of the magnetic ceramic portion 18, for example, the (Ni, Zn, Cu)—$Fe_2O_4$ series ferrite material is prepared.

By mixing a binder into respective materials, a dielectric green sheet and a magnetic green sheet are formed. On the surface of the dielectric green sheet and magnetic green sheet, an electrode material such as an electric conductor as the internal electrode is printed respectively. The dielectric green sheet and the magnetic green sheet are cut into a predetermined size.

As the material of the intermediate layer 16, a ceramic material containing, for example, $0.5Pb(Fe_{1/2} Nb_{1/2})O_3$—$0.5Pb(Ni_{1/2} Nb_{1/2})O_3$ as a main component is prepared.

The dielectric green sheet and magnetic green sheet cut into the predetermined size are laminated so as to put the above-mentioned ceramic material layer therebetween to form a laminate. In this case, the dielectric green sheets are laminated in such a manner that the number of sheets thereof corresponds to the thickness of the dielectric ceramic portion 12, and the magnetic green sheets are laminated in such a manner that the number of sheets thereof corresponds to the thickness of the magnetic ceramic portion 18. The ceramic material layer 16 is formed into the thickness corresponding to that of the intermediate layer 16.

Then, the laminate is pressed in a laminated direction by means of a single-shaft press at 50° C. and 1 ton/cm². The resulting laminate is cut into a predetermined size at, for example, 50° C.

The resulting laminate is left as it is for 1 hour at 500° C. to remove the binder therefrom. When heating the laminate up to 500° C., 1° C. is raised per minute.

The laminate is then sintered for 2 hours at 1000° C., and thereby the dielectric ceramic portion 12, intermediate layer 16 and magnetic ceramic portion 18 are co-sintered. When heating the laminate up to 1000° C., 2° C. are raised per minute.

Then, for example, an Ag paste is coated on the end portions of the sintered dielectric ceramic portion 12, intermediate layer 16 and magnetic ceramic portion 18, and the coated Ag paste is baked at, for example, 800° C. to form the external electrodes 22.

In the composite electronic part 10, since the intermediate layer 16 consisting of the ceramic material containing Pb, Ni, Fe and Nb as the main components is formed between the dielectric ceramic portion 12 consisting of the Pb group dielectric material and the magnetic ceramic portion 18 consisting of the Ni—Zn group ferrite material, the dielectric ceramic portion 12 and the magnetic ceramic portion 18 are firmly bonded together by the intermediate layer 16.

Furthermore, in the composite electronic part 10, since mutual diffusion between the dielectric ceramic portion 12 consisting of the Pb group dielectric material and the magnetic ceramic portion 18 consisting of the Ni—Zn group ferrite material is prevented by the intermediate layer 16, deterioration of electrical characteristics is suppressed.

Figure 2:
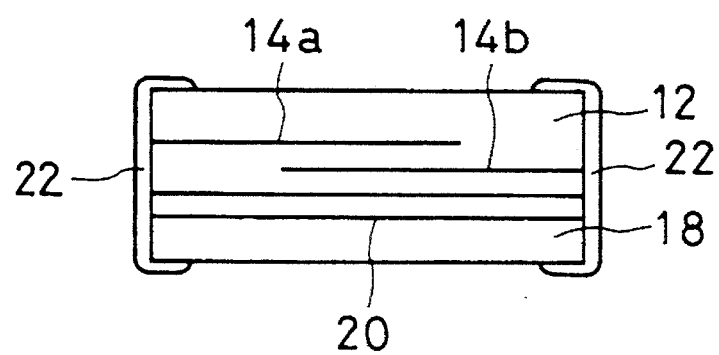
FIG. 2 is a sectional illustrative view showing a comparative example.
Figure 3:
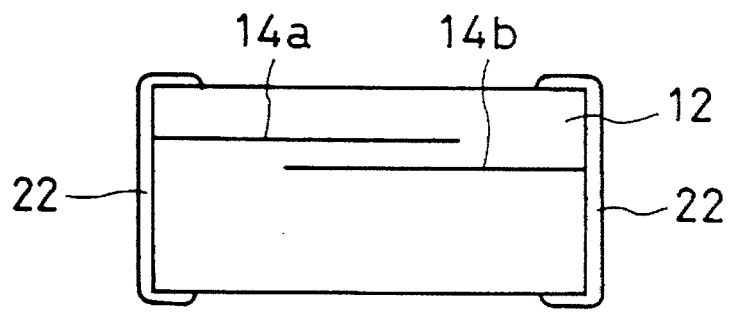
FIG. 3 is a sectional illustrative view showing a laminated capacitor.

As an example for experiment, the above-mentioned composite electronic part, a comparative example in which an intermediate layer is not formed when compared with the composite electronic part as shown in FIG. 2, and a discrete laminated capacitor in which the intermediate layer and the magnetic ceramic portion are not formed when compared with the composite electronic part as shown in FIG. 3, were prepared. For the composite electronic part, comparative example and laminated capacitor, capacitance (nF) between the internal electrodes 14a and 14b, a dielectric loss (%) and insulation resistance IR ($\Omega$) were measured, respectively. The measured results are shown in Table 1. In Table 1, the insulation resistance IR ($\Omega$) is shown in logarithm.

As it is apparent from the measured results shown in Table 1, in the comparative example where the intermediate layer does not exist, the dielectric loss increases and the insulation resistance reduces considerably as compared with the discrete laminated capacitor, and in the composite electronic part including the intermediate layer, as compared with the comparative example, the dielectric loss is small, the insulation resistance is large and electrical characteristics are close to that of the discrete laminated capacitor.

Although one dielectric ceramic portion and one magnetic ceramic portion are bonded by the intermediate layer in the above-mentioned embodiment, the present invention is also applicable to the composite electronic part, wherein the magnetic ceramic portions are bonded to both sides of one dielectric ceramic portion by the intermediate layers, to the composite electronic part wherein the dielectric ceramic portions are bonded to both sides of one magnetic ceramic portion by the intermediate layers, and to the composite electronic part wherein a plurality of dielectric ceramic portions and a plurality of magnetic ceramic portions are bonded together alternately by the intermediate layers.

Although the surface of one dielectric ceramic portion and the surface of one magnetic ceramic portion are bonded together by the intermediate layer in the above-mentioned embodiment, the present invention is also applicable to the composite electronic part wherein a depression is formed in either of the dielectric ceramic portion or the magnetic ceramic portion, and the different ceramic portion is bonded into the depression by the intermediate layer.

While the present invention has been particularly described and shown, it is to be understood that such description is used merely as an illustration and example rather than limitation, and the spirit and scope of the present invention is determined solely by the terms of the appended claims.

TABLE 1

|  | CAPACITANCE | DIELECTRIC LOSS | log IR |
|---|---|---|---|
| LAMINATED CAPACITOR | 1.50 (nF) | 0.10 (%) | 10.1 |
| COMPARATIVE EXAMPLE | 1.57 (nF) | 2.27 (%) | 7.97 |
| COMPOSITE ELECTRONIC PART | 1.60 (nF) | 0.87 (%) | 9.05 |

What is claimed is:

1. A composite electronic part comprising a dielectric ceramic portion and a magnetic ceramic portion which are co-sintered, wherein said dielectric ceramic portion is a lead composite perovskite compound which is represented by the formula $PbAO_3$, where A is a tetravalent ion containing at least one member selected from the group consisting of Bi, Mg, Fe, Co, Ba, Ca, Sr, Zr, Sn, Sb, Ge, Ni, Zn, W, Cu, Nb, Ti and Mn, said magnetic ceramic portion is a (Ni, Zn, Cu)—$Fe_2O_3$ series ferrite material, and an intermediate layer consisting of a ceramic material containing Pb, Ni, Fe and Nb as main components is between said dielectric ceramic portion and said magnetic ceramic portion.

2. A composite electronic part in accordance with claim 1, wherein the material of said dielectric ceramic portion is a $Pb(Ni_{1/3} Nb_{2/3})O_3$—$Pb(Zn_{1/2} W_{1/2})O_3$—$PbTiO_3$—$Pb(Cu_{1/3} Nb_{2/3})O_3$ series material.

3. A composite electronic part in accordance with claim 1, wherein an internal electrode for capacitor is in said dielectric ceramic portion, an internal electrode for inductor is in said magnetic ceramic portion, and having external electrodes connected to said internal electrode for capacitor and said internal electrode for inductor.

4. A composite electronic part in accordance with claim 2, wherein an internal electrode for capacitor is in said dielectric ceramic portion, an internal electrode for inductor is in said magnetic ceramic portion, and having external electrodes connected to said internal electrode for capacitor and said internal electrode for inductor.

* * * * *